United States Patent
Hao et al.

(10) Patent No.: US 9,983,253 B2
(45) Date of Patent: May 29, 2018

(54) METHOD AND APPARATUS FOR IDENTIFYING THE WINDING SHORT OF BAR WOUND ELECTRIC MACHINE AT STANDSTILL CONDITION

(71) Applicant: GM GLOBAL TECHNOLOGY OPERATIONS LLC, Detroit, MI (US)

(72) Inventors: Lei Hao, Troy, MI (US); Cristian A. Lopez-Martinez, Okemos, MI (US); Chad A. Freitas, Metamora, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 276 days.

(21) Appl. No.: 14/882,209

(22) Filed: Oct. 13, 2015

(65) Prior Publication Data
US 2017/0102425 A1 Apr. 13, 2017

(51) Int. Cl.
*G01R 31/02* (2006.01)
*G01R 31/06* (2006.01)
*G01R 31/34* (2006.01)

(52) U.S. Cl.
CPC .......... *G01R 31/06* (2013.01); *G01R 31/346* (2013.01)

(58) Field of Classification Search
USPC .......................................... 324/765, 545–547
See application file for complete search history.

(56) References Cited

U.S. PATENT DOCUMENTS

| | | | |
|---|---|---|---|
| 8,054,084 B2 | 11/2011 | Schulz et al. | |
| 8,866,428 B2 | 10/2014 | Hao et al. | |
| 9,018,881 B2 | 4/2015 | Mao et al. | |
| 2004/0227520 A1* | 11/2004 | Saunders | G01R 31/34 324/511 |
| 2012/0319722 A1* | 12/2012 | Zhang | G01R 31/346 324/765.01 |
| 2013/0054043 A1* | 2/2013 | Klodowski | G01R 31/343 700/293 |

FOREIGN PATENT DOCUMENTS

CN 102081129 A * 6/2011

* cited by examiner

*Primary Examiner* — Vincent Q Nguyen
(74) *Attorney, Agent, or Firm* — John A. Miller; Shumaker, Loop & Kendrick, LLP

(57) ABSTRACT

A method and system are disclosed for detecting turn-to-turn and phase-to-phase winding short circuits in an electric motor. The motor is tested at a standstill condition by injecting a current signal into the virtual d-axis of the motor while controlling q-axis current to zero. Steady state feedback current from the motor is measured, and current harmonics are calculated using FFT or peak-to-peak techniques. It is determined that a short circuit is present in the winding if feedback current harmonics higher than a nominal level are detected, where the increased feedback current is an indication that winding inductance has decreased due to a short circuit. Testing at standstill using a small current advantageously prevents the possibility of damaging the motor and avoids inductance variation due to changing rotor position.

20 Claims, 3 Drawing Sheets

METHOD AND APPARATUS FOR IDENTIFYING THE WINDING SHORT OF BAR WOUND ELECTRIC MACHINE AT STANDSTILL CONDITION

BACKGROUND OF THE INVENTION

Field of the Invention

This invention relates generally to short circuit detection in electric machines and, more particularly, to a technique for identifying turn-to-turn and phase-to-phase winding shorts in an electric motor at standstill by injecting a current signal into the virtual d-axis of the motor while controlling q-axis current to zero, measuring feedback current from the motor, and determining that a short circuit is present in the winding if winding inductance has decreased as indicated by increased feedback current harmonics.

Discussion of the Related Art

Known electric motors include permanent magnet electric motors and other induction motors that transform electric power to mechanical torque. Permanent magnet electric motors may be multiphase permanent magnet (PM) electric motors that include permanent magnets as part of a rotor core and aligned longitudinally with an axis of rotation. Known stators include an annular stator core and a plurality of electrical windings. Stator cores commonly include a plurality of radial inwardly projecting tooth elements that are parallel to a longitudinal axis of the electric motor and define an inner circumference of the stator. Contiguous radial inwardly projecting tooth elements form radially-oriented longitudinal slots.

Electrical windings are fabricated from strands of suitable conductive material, e.g., copper or aluminum, and are woven or otherwise arranged into coil groups that are inserted into the radially-oriented slots between the tooth elements. Electrical windings are arranged electrically in series in circular fashion around the slots of the stator core, with each electrical winding associated with a single phase of the electric motor. Each coil group of the electrical windings provides a single pole of a single phase of motor operation. The quantity of radially-oriented slots in the stator core is determined based upon the quantity of phases and poles of the electrical wiring windings for the electric motor. Thus, a three-phase, two-pole motor will have electrical windings that are configured as six coil groups. Current flow through the electrical windings is used to generate rotating magnetic fields that act on the rotor to induce torque on a shaft of the rotor.

Known rotors for permanent magnet electric motors include a rotor core attached to a rotating shaft that defines an axis of rotation, and have a plurality of rotor magnets positioned around the circumference near an outer surface of the rotor core, with each rotor magnet aligned longitudinally with the axis of rotation.

Known electric motors include an air gap between tooth elements of the stator and an outer surface of the rotor. The air gap is a design feature that physically separates the rotor and stator to accommodate manufacturing tolerances and facilitate assembly. The air gap is preferably minimized, as an increased air gap correlates to reduced magnetic flux and associated reduced output torque of the electric motor.

When electric current flows through the stator windings, a magnetic field is induced along the electrical windings to act upon the rotor magnets of the rotor element. The magnetic field induces torque on the rotating shaft of the rotor. When the magnetic field induces sufficient torque to overcome bearing friction and any induced torque load on the shaft, the rotor rotates the shaft.

Each of the coils in the stator winding contains several "turns" of insulated conductor. The rotor winding is subjected to a variety of loads, stresses and environmental factors—including centrifugal forces, thermal expansion/contraction, vibration, high voltages and high temperatures—which can lead to deterioration and breakdown of the insulation. When the insulation breaks down, a short circuit between adjacent turns of the winding, or turn-to-turn short circuit, results. In other circumstances, rotor windings can develop a phase-to-phase short circuit.

Winding short circuit faults, if present during operation, can cause motor damage or failure. It is therefore desirable to detect short circuits before motor operation, when the motor is at a standstill.

SUMMARY OF THE INVENTION

In accordance with the teachings of the present invention, a method and system are disclosed for detecting turn-to-turn and phase-to-phase winding short circuits in an electric motor. The motor is tested at a standstill condition by injecting a current signal into the virtual d-axis of the motor while controlling q-axis current to zero. Steady state feedback current from the motor is measured, and current harmonics are calculated using FFT or peak-to-peak techniques. It is determined that a short circuit is present in the winding if feedback current harmonics above a nominal level are detected, where the increased feedback current is an indication that winding inductance has decreased due to a short circuit. Testing at standstill using a small current advantageously prevents the possibility of damaging the motor and avoids inductance variation due to changing rotor position.

Additional features of the present invention will become apparent from the following description and appended claims, taken in conjunction with the accompanying drawings.

DETAILED DESCRIPTION OF THE EMBODIMENTS

The following discussion of the embodiments of the invention directed to a method and apparatus for diagnosing a stator winding short circuit by detecting an inductance reduction in the winding is merely exemplary in nature, and is in no way intended to limit the invention or its applications or uses.

Electric motors are used for many applications, and have become an indispensable part of modern life. One increasingly common use of electric motors is to provide propulsion in electric vehicles and hybrid-electric vehicles. In such vehicles, a high-capacity battery pack stores electrical energy—which may come from a plug-in charge, or an onboard engine/generator, or both—and the battery pack provides the electrical energy to the motor to drive the vehicle. Although the battery pack itself can provide only direct current (DC), an inverter may be used to provide alternating current (AC) to the motor, which may be a three-phase permanent magnet (PM) motor, for example. Regardless of the exact type of electric motor, most AC motors used in vehicle applications include a stator with a laminated core and conductive windings. Because the stator windings are subjected to thermal and mechanical stresses, potentially high voltages and other environmental factors, the windings are susceptible to short circuits. Winding short circuits degrade motor performance and can cause significant damage to a motor, thus making it highly desirable to test for and detect short circuits regularly, before motor operation.

Figure 1B:
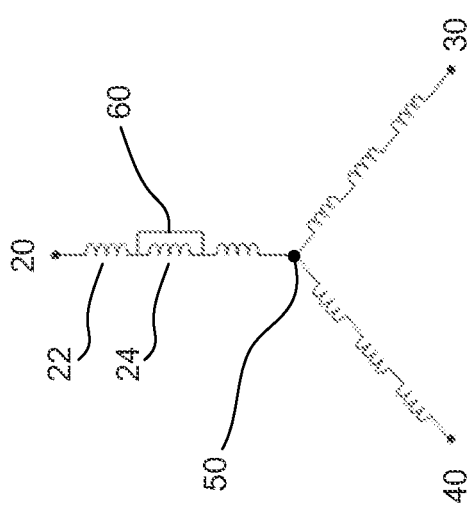
FIGS. 1A and 1B are simplified schematic diagrams of electric motor windings showing the effect of short circuits on winding inductance.
Figure 1A:
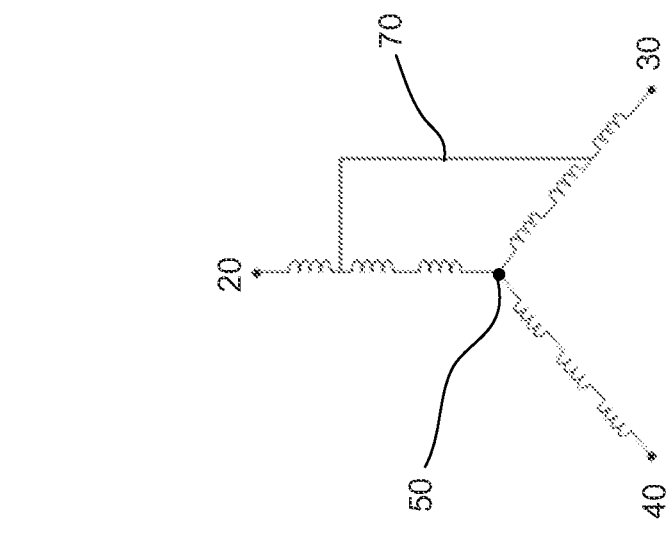

FIGS. 1A and 1B are simplified schematic diagrams of electric motor windings which may be used to illustrate the effect of a turn-to-turn short circuit and a phase-to-phase short circuit, respectively, on winding inductance. FIGS. 1A and 1B show stator windings 10 and 12, respectively, for a typical three-phase electric motor. The windings 10 and 12 each include a first phase winding with contact 20, a second phase winding with contact 30 and a third phase winding with contact 40, where all three winding phases connect at a common neutral point 50. Each of the phases of the windings 10 and 12 include a plurality of turns, such as turns 22 and 24 in the first phase. The turns 22 and 24 may be one turn or several turns.

Each of the turns in the windings 10 and 12 consists of a loop of conductor which possesses a significant inductance, where the conductor loops are routed through slots in the stator core. For illustration purposes, the winding 10 includes a turn-to-turn short circuit 60, which shorts across the turns 24, thereby eliminating the turns 24 from the path of the current flowing through the first phase of the winding 10. This elimination of the turns 24 causes a significant reduction in the inductance of the first phase of the winding 10, which can be exploited in a method and apparatus for short circuit detection, as discussed in detail below.

Similarly, the winding 12 includes a phase-to-phase short circuit 70, which creates a short circuit path from the first phase to the second phase of the winding 12. The phase-to-phase short circuit 70 also causes a reduction in the inductance of the winding 12 which can be detected and diagnosed as a winding short circuit.

Figure 2:
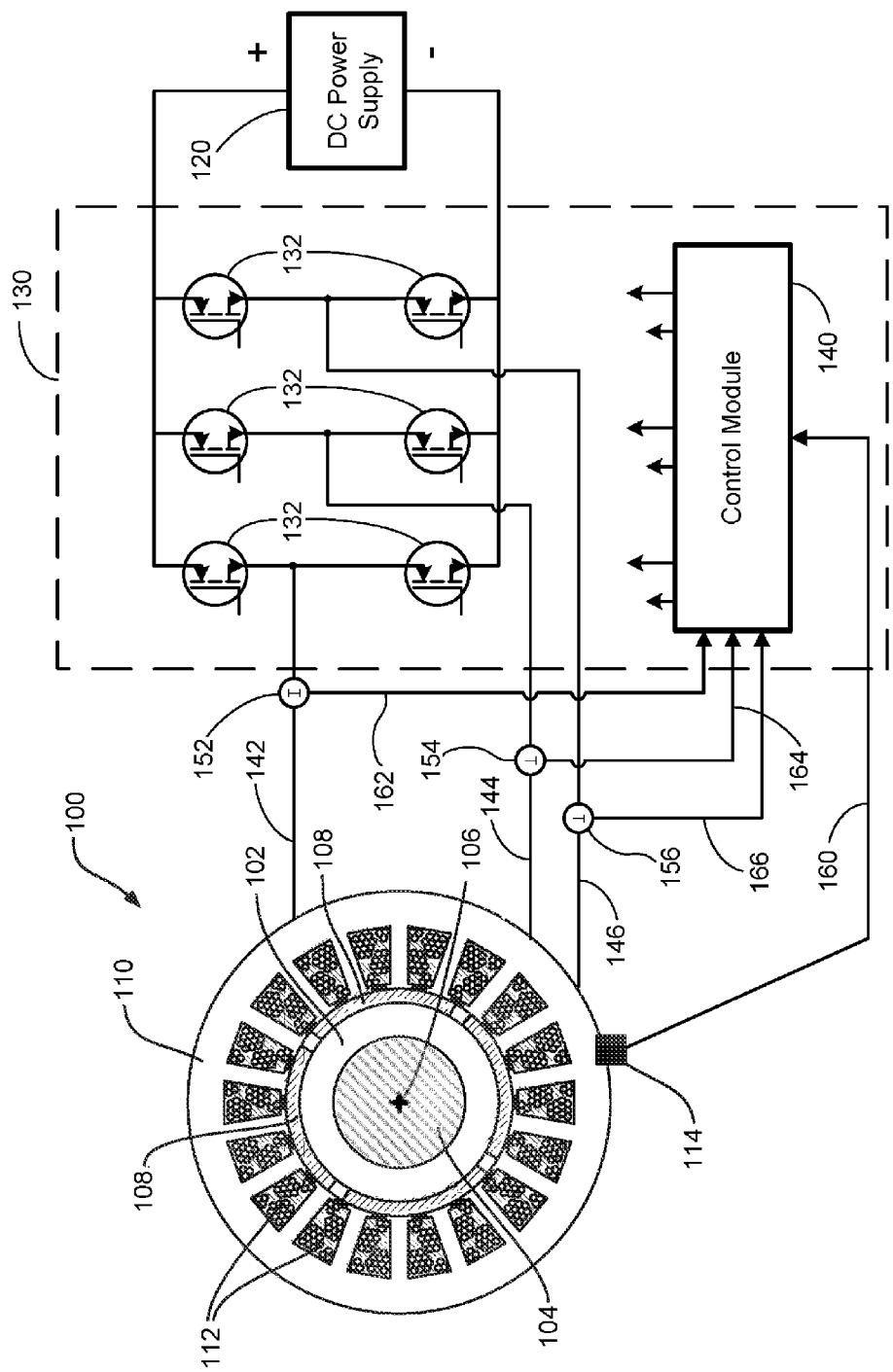
FIG. 2 is a schematic diagram of an electric motor and an inverter/controller system used for diagnosing a stator winding short circuit by detecting an inductance reduction in the winding.

FIG. 2 is a schematic diagram of an electric motor connected to a power supply and an inverter/controller system. The system shown in FIG. 2 controls regular operation of the motor, and also identifies rotor winding shorts by detecting a reduction in the inductance of the stator windings, as described in principle above with reference to FIG. 1, and described in detail below.

A motor 100 is used as the drive motor for an electric vehicle or hybrid-electric vehicle, where the motor 100 shown in FIG. 2 is a three-phase permanent magnet (PM) motor. The motor 100 includes a rotor 102 mounted on a shaft 104. A center line of the shaft 104 defines a longitudinal axis that is an axis of rotation 106 of the rotor 102. The rotor 102 includes a plurality of permanent magnets 108 mounted or otherwise attached at or near an external surface thereof.

The rotor 102 is inserted into a coaxial hollow cylindrical stator 110. The stator 110 includes a plurality of stator windings 112 arranged in a multiphase manner. The permanent magnet electric motor 100 includes a case having end caps (not shown), and the shaft 104 of the rotor 102 is rotatably mounted on bearing surfaces of the end caps. The cross-sectional view of the permanent magnet electric motor 100, in FIG. 2, is shown orthogonal to the axis of rotation 106 of the rotor 102. A rotational position sensor 114 (location shown conceptually in FIG. 2) is suitably mounted to monitor an angular position of the rotor 102, from which a rotational speed can be determined.

The motor 100, of course, may be of a different architecture, and may be used for other applications besides vehicle propulsion, and still be suitable for use with the disclosed invention. It should be appreciated that the permanent magnet electric motor 100 be replaced with an induction machine, a wound synchronous machine, or another suitable electric motor with similar effect.

A DC power supply 120, typically a high-capacity battery pack, provides electrical energy for the motor 100. The DC power supply 120 may be charged by plugging in to the electric grid, or charged by a generator driven by an onboard engine, or both. An inverter/controller system 130 converts DC energy from the power supply 120 into three-phase AC which is provided to the motor 100.

The inverter/controller system 130 includes a plurality of gate drives 132 for selectively switching the DC signal from the power supply 120 to provide a three-phase pulse-width modulated (PWM) signal to the motor 100. The gate drives 132 are controlled by a control module 140. Pairs of the gate drives 132 correspond to selected portions of the stator windings 112 of the permanent magnet electric motor 100 and are arranged in a suitable manner to control individual phases thereof. As shown, there are six of the gate drives 132 arranged in three pairs to control flow of electric power to the permanent magnet electric motor 100 in three phases. The gate drives 132 may include insulated gate bipolar transistors (IGBTs) or other suitable switching devices.

The inverter/controller system 130 electrically connects to the permanent magnet electric motor 100 using a quantity of electrical leads corresponding to the plurality of stator windings 112, including electrical leads 142, 144, and 146 corresponding to the three phases—A, B and C—of the PM motor. Current monitoring sensors 152, 154 and 156 are configured to monitor electric current across leads 142, 144 and 146 for the three phases, respectively, thus generating corresponding current signals on lines 162, 164 and 166 that are monitored by the control module 140. Sometimes, for Y connection machines as shown in FIG. 1, two current sensors such as 152 and 154 are used and input to the control module 140. The third current is calculated based on the signal of the current sensors 152 and 154 since the sum of three phase current is equal to zero.

In normal motor operation, the control module 140 sequentially activates the gate drives 132 to transfer electric current from the high-voltage DC power supply 120 to the phases of the stator windings 112. The electric current induces a magnetic field in the stator windings 112 that acts on the permanent magnets 108 and induces rotation of the rotor 102 on the shaft 104 about the axis of rotation 106. The angular position of the rotor 102 is monitored with the rotational position sensor 114, which provides a signal to the control module 140 on line 160. Using the rotor angular position data on the line 160 and the measured current data on the lines 162, 164 and 166, the control module 140 controls timing of activation of the gate drives 132 to control rotational speed and torque output of the motor 100.

As discussed above, the inverter/controller system 130 of FIG. 2 is used onboard the electric vehicle for motor control during vehicle operation. The novelty of the system 130 is that the control module 140 is configured not only to control the motor for vehicle operation, but also to test for and detect stator winding short circuits when the vehicle is at a standstill, as will be discussed in detail below. The stator winding short detection can be performed any time the vehicle is at a standstill, but preferably when the vehicle is in "Park" and/or turned off, or during a vehicle start-up cycle.

A simple overview of the method used by the inverter/controller system 130 for detecting winding short circuits in the motor 100 is as follows. The motor 100 is tested at a standstill condition by injecting a current signal into the virtual d-axis of the motor 100 while controlling q-axis current to zero. Steady state feedback current from the motor 100 is measured, and current harmonics are calculated using FFT or peak-to-peak techniques. It is determined that a short circuit is present in the stator windings 112 if feedback current harmonics above a nominal level are detected, where the increased feedback current is an indication that winding inductance has decreased due to a short circuit.

Following is a detailed discussion of the technique briefly outlined above.

In electrical engineering, direct-quadrature-zero (abbreviated dq0 or dqo) transformation is a mathematical transformation that rotates the reference frame of three-phase systems in order to simplify the analysis of three-phase circuits. In the case of balanced three-phase circuits, application of the dqo transform reduces the three AC quantities to two DC quantities. Simplified calculations can then be carried out on these DC quantities before performing the inverse transform to recover the actual three-phase AC results. A dqo transformation is often used in order to simplify the analysis of three-phase synchronous machines or to simplify calculations for the control of three-phase inverters. In analysis of three-phase synchronous machines, the transformation transfers three-phase stator and rotor quantities into a single rotating reference frame to eliminate the effect of time varying inductances.

The dqo transformation can be thought of in geometric terms as the projection of the three separate sinusoidal phase quantities onto two axes rotating with the same angular velocity as the sinusoidal phase quantities. The two axes are called the direct axis (d-axis) and the quadrature axis (q-axis), where the q-axis is at an angle of 90 degrees from the d-axis.

Winding short testing of the motor 100 uses pulse width modulated (PWM) voltage inputs computed with closed-loop current control. To keep the motor 100 at standstill, the q-axis current ($I_q$) is controlled to zero. Motor torque can be computed as:

$$T = \frac{3}{2} \cdot \frac{P}{2} [\lambda_m I_q + (L_d - L_q) I_d I_q] \tag{1}$$

Where P is the number of poles, $\lambda_m$ is flux density from the permanent magnets 108, $I_q$ and $I_d$ are the q-axis and d-axis currents, and $L_q$ and $L_d$ are the q-axis and d-axis inductances of the windings.

According to Equation [1], the motor 100 won't produce torque (and therefore will remain at standstill) if $I_q$ is zero. Controlling the motor 100 to a zero torque standstill condition allows the motor 100 to be tested before vehicle operation, and also improves the accuracy of the short detection method by avoiding inductance variation due to rotor position and saturation.

Because the motor 100 is at standstill and the current $I_q$ is controlled to zero, machine voltage equations are given as:

$$V_d = r_s I_d + L_d \frac{dI_d}{dt} \tag{2}$$

$$V_q = 0 \tag{3}$$

Where $V_d$ and $V_q$ are the d-axis and q-axis motor voltages, $r_s$ is the stator winding resistance, and other variables have been defined previously.

If part of the stator windings 112 are short circuited, both machine resistance $r_s$ and inductance $L_d$ decrease. Since inductance is proportional to the square of the number of turns, a small variation in winding turns (due to the short circuit) can cause much higher variation in inductance. That is, a short circuit in the windings 112, which effectively decreases the number of turns that the current passes through, results in an even greater decrease in the winding inductance. According to Equation (2), lower inductance leads to higher current variation for a given voltage, i.e. higher current ripple if a pulse width modulated (PWM) voltage is applied.

The short detection technique disclosed herein employs the fact that an inductance change (due to a winding short) can be detected in a current signal signature by comparing the current signal to that of a known healthy motor. To this end, Equation (2) can be re-written as:

$$V_d = r_s \Delta I_d + L_d \frac{\Delta I_d}{\Delta t} \tag{4}$$

Ignoring the resistance, because its effect is much smaller than that of inductance, the ratio of current difference between a faulted and a healthy machine is given by:

$$\frac{\Delta I_{faulted}}{\Delta I_{healthy}} = \frac{L_{d_{healthy}}}{L_{d_{faulted}}} \tag{5}$$

Equation (5) indicates that a current signature of a tested motor can be compared to a current signature of a known healthy motor in order to determine if the tested motor has an inductance that is out of proportion with the inductance of the known healthy motor. It can be seen in Equation (5) that the ratio is independent of current level. This means that a small testing current can be applied to the motor 100 and it doesn't impact the sensitivity of fault signature. In testing of the disclosed technique, 1-4% of the motor's rated current was applied, and results verify that such small currents are suitable for winding short detection in the disclosed manner.

Using all of the above as theoretical background, the disclosed short detection technique applies a PWM voltage signal to the motor 100 which controls the q-axis current to zero (therefore no motor rotation) and the d-axis current to about 1-10% of the motor's rated current. Feedback current is measured using the current sensors 152-156, and the feedback current is monitored until reaching steady state. A ratio of amplitude of current harmonics from FFT or a ratio of peak-to-peak (PTP) current values between faulted and healthy machine can be used as the signature to detect faults. If the ratio of the tested motor current signature to the known healthy motor current signature is greater than a predetermined threshold, then it can be concluded that the tested motor has a lower inductance indicative of a rotor winding short circuit.

Figure 3:
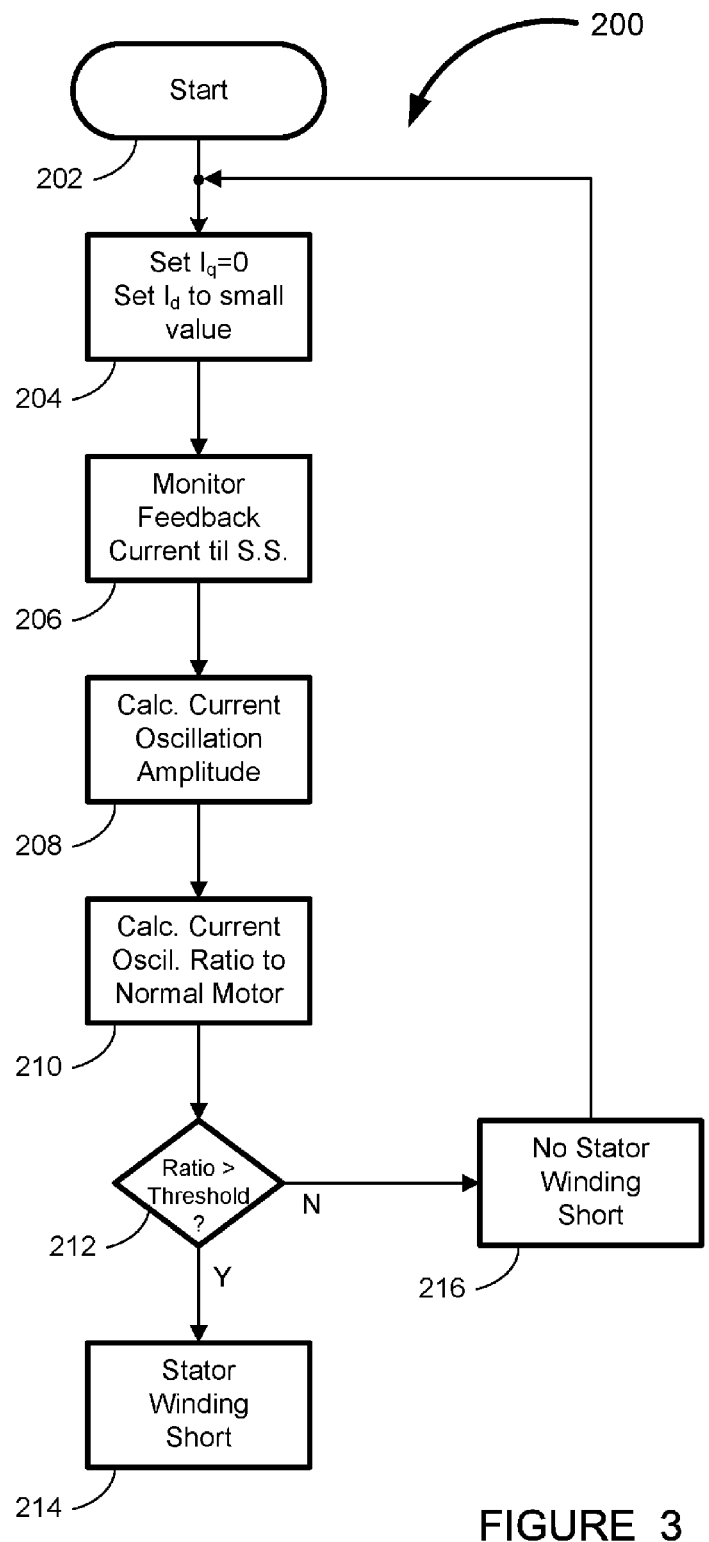
FIG. 3 is a flowchart diagram of a method for diagnosing a stator winding short circuit by detecting an inductance reduction using a d-axis current injection with the motor at standstill.

FIG. 3 is a flowchart diagram 200 of a method for diagnosing a stator winding short circuit by detecting an inductance reduction using a d-axis current injection with the motor at standstill.

Table 1 is provided as a key associated with the flowchart diagram 200 described with reference to FIG. 3, wherein the numerically labeled boxes and the corresponding functions are set forth as follows.

TABLE 1

| BOX # | BOX DESCRIPTION/FUNCTION |
|---|---|
| 202 | Start |
| 204 | Set $I_q$ to zero, and $I_d$ to 1-10% of the motor's rated current |
| 206 | Monitor feedback current until it reaches steady state |
| 208 | Calculate current harmonics using FFT or peak-to-peak |
| 210 | Calculate ratio of FFT or PTP current of tested to healthy motor |
| 212 | Ratio greater than threshold? |
| 214 | If ratio > threshold, then motor winding is shorted |
| 216 | If ratio ≤ threshold, then motor winding is healthy (not shorted) |

The process begins at start oval 202. At box 204, the control module 140 commands a q-axis current of zero and a d-axis current of about 1-10% of the motor's rated current. These current commands are provided to the motor 100 by the gate drives 132 receiving PWM control commands from the control module 140. At box 206, feedback current is monitored until the feedback current reaches steady state.

At box 208, a current oscillation amplitude for at least the primary motor control harmonic is calculated using Fast Fourier Transform (FFT), or a peak-to-peak (PTP) current value for the first harmonic is determined. At box 210, the ratio of the FFT current amplitude or peak-to-peak current of the tested motor to those of a known healthy motor are calculated. For example, if the tested motor has a PTP current value at the first harmonic frequency which is 50% greater than the PTP current value at the first harmonic frequency for the known healthy motor, the ratio would be equal to 1.5. At decision diamond 212, it is determined whether the ratio calculated at the box 210 is greater than a predetermined threshold. The threshold may be a value such as 1.25, 1.5, etc.

At box 214, if the current ratio (of the motor presently being tested to the motor in a known healthy state) is greater than the threshold, indicating a significantly lower winding inductance, then it is determined that a stator winding short circuit is present in the motor 100. The winding short prognosis could involve more than just the evaluation of the current ratio relative to the threshold, and the resultant action taken could be dependent upon the prognosis. For example, a current ratio which is just slightly over the threshold may be an indication of a minor turn-to-turn winding short, and in this case the motor 100 may still be usable for a limited amount of time, or at a limited power level, without causing further damage. On the other hand, a current ratio which is much higher than the threshold may be an indication of a phase-to-phase short or a severe turn-to-turn short, and it may be necessary in this case to prevent further operation of the motor 100. In addition, the stator winding short diagnosis and prognosis may include other analyses, such as calculating current ratios for the first harmonic of motor drive frequency, the second harmonic, the third harmonic, etc., and using the current ratios from all of the calculated harmonics to diagnose the nature and the severity of a detected stator winding short. A significant amount of information about the nature of the stator winding short may be gleaned from these detailed analyses of the measured feedback current, while the test technique itself is simply that which has been described above at the boxes 204-208.

At box 216, if the ratio is not greater than the threshold, then it is determined that the motor 100 is healthy; that is, no stator winding short is present in the motor 100. After a diagnosis of a healthy motor at the box 216, the process returns to the box 204, where the test method is performed again at an appropriate time, such as when the vehicle is parked and/or turned off, or upon vehicle start-up.

Of course, any diagnosis and prognosis of a stator winding short circuit at the box 214 would be stored in a vehicle non-volatile memory, used to trigger a diagnostic trouble code (DTC), display information or warnings to the vehicle driver, and take other actions in the vehicle as appropriate.

The stator winding short detection technique is also applicable to motors used for applications other than as an electric vehicle drive motor—such as motors used in industrial machinery. As long as the motor 100 has a control system generally equivalent to that shown in FIG. 2, the technique is applicable. In the case of an industrial motor, the motor 100 would be short-tested when the machinery is off, such as at night, and any detected short circuits would be displayed on a human-machine interface.

The technique described above provides many advantages in detecting stator winding short circuits in three-phase electric motors. First, the technique can be implemented at a very low cost, as no additional hardware is required. The control module 140 must simply be provided with additional programming needed to run the controlled test and evaluate the results.

In addition, the disclosed technique detects faults at standstill without possibility of damaging the motor 100 through testing due to low testing currents. Also, by detecting any stator winding short circuit before motor operation, the system 130 can prevent or restrict further motor operation which might significantly damage the motor 100.

Furthermore, the disclosed technique is very fast in detecting stator winding short circuits. It is also very sensitive to stator winding shorts, as inductance of the affected winding changes dramatically in the event of a short circuit. These and other advantages of the stator winding short diagnosis method allow electric vehicle manufacturers to ensure that the vehicle drive motor is operating at peak performance, and to detect many winding short problems while they are minor in nature. The same advantages may also be realized for motors used in other industrial applications.

Control module, module, control, controller, control unit, processor and similar terms mean any suitable one or various combinations of one or more of Application Specific Integrated Circuit(s) (ASIC), electronic circuit(s), central processing unit(s) (preferably microprocessor(s)) and associated memory and storage (read only, programmable read only, random access, hard drive, etc.) executing one or more software or firmware programs, combinatorial logic circuit(s), input/output circuit(s) and devices, appropriate signal conditioning and buffer circuitry, and other suitable components to provide the described functionality. The control module 140 has a set of control algorithms, including resident software program instructions and calibrations stored in memory and executed to provide the desired functions. The algorithms may be executed during preset loop cycles, or in response to occurrence of an event. Algorithms are executed, such as by a central processing unit, and are operable to monitor inputs from sensing devices and other networked control modules, and execute control and diagnostic routines to control operation of actuators, power switches such as the gate drives 132, etc.

The foregoing discussion discloses and describes merely exemplary embodiments of the present invention. One skilled in the art will readily recognize from such discussion and from the accompanying drawings and claims that various changes, modifications and variations can be made therein without departing from the spirit and scope of the invention as defined in the following claims.

What is claimed is:

1. A method for identifying stator winding short circuits in a three-phase electric machine, said method comprising:
   providing voltage inputs to each of three phases of stator windings, where the voltage inputs induce electric currents in the three phases of the stator windings, and the currents result in zero torque being created by the electric machine, including using a pair of gate drives for each of the three phases to transform energy from a direct current (DC) power supply into pulse-width-modulated (PWM) voltage inputs which are provided to the three phases of the stator windings;
   monitoring feedback current signals in the three phases of the stator windings, using current sensors, until the feedback current signals reach steady state;
   computing, using a microprocessor, a current amplitude value from the feedback current signals;
   computing a ratio of the current amplitude value for the electric machine in a present test to the current amplitude value for the electric machine in a known healthy state; and
   determining that a stator winding short circuit exists in the electric machine if the ratio exceeds a predetermined threshold.

2. The method of claim 1 wherein the microprocessor, the gate drives, the current sensors and the DC power supply are used for providing power and control during normal operation of the electric machine in addition to being used for identifying stator winding short circuits.

3. The method of claim 1 wherein providing voltage inputs to each of three phases of stator windings includes performing a direct-quadrature-zero (dqo) transformation and determining the voltage inputs in terms of a q-axis and a d-axis.

4. The method of claim 3 wherein the voltage inputs are selected to produce a q-axis current of zero in order to create zero torque, and produce a d-axis current which is non-zero.

5. The method of claim 4 wherein the d-axis current is in a range of 1-10% of a maximum rated current for the electric machine.

6. The method of claim 1 wherein computing a current amplitude value from the feedback current signals includes using a Fast Fourier Transform (FFT) calculation or computing a peak-to-peak value.

7. The method of claim 1 further comprising computing current amplitude values for a plurality of harmonics of a motor control frequency.

8. The method of claim 7 further comprising diagnosing, if a stator winding short circuit is present, whether the stator winding short circuit is a turn-to-turn short or a phase-to-phase short, based on the current amplitude values for the plurality of harmonics.

9. The method of claim 1 wherein the electric machine is an electric motor used for propulsion of an electric vehicle, and the method is performed when the electric vehicle is turned off or during vehicle start-up.

10. A method for identifying stator winding short circuits in a three-phase electric motor, said motor being used for propulsion of an electric vehicle, said method comprising:
    providing pulse-width-modulated (PWM) voltage inputs to each of three phases of stator windings of the motor, where the PWM voltage inputs induce electric currents in the three phases of the stator windings, and the PWM voltage inputs are determined using a direct-quadrature-zero (dqo) transformation to produce a q-axis current of zero in order to create zero torque, and produce a d-axis current which is in a range of 1-10% of a maximum rated current for the motor;
    monitoring feedback current signals in the three phases of the stator windings, using current sensors, until the feedback current signals reach steady state;
    computing, using a microprocessor, a current amplitude value from the feedback current signals, where the current amplitude value is for a first harmonic of a motor control frequency and is calculated using a Fast Fourier Transform (FFT) calculation or computing a peak-to-peak value;
    computing a ratio of the current amplitude value for the motor in a present test to the current amplitude value for the motor in a known healthy state; and
    determining that a stator winding short circuit exists in the motor if the ratio exceeds a predetermined threshold.

11. The method of claim 10 wherein providing PWM voltage inputs to each of three phases of stator windings includes using a pair of gate drives for each of the three phases to transform energy from a direct current (DC) power supply into the PWM voltage signals.

12. The method of claim 10 further comprising computing current amplitude values for a plurality of harmonics of the motor control frequency, and diagnosing, if a stator winding short circuit is present, whether the stator winding short circuit is a turn-to-turn short or a phase-to-phase short, based on the current amplitude values for the plurality of harmonics.

13. A system for controlling an electric motor and detecting a stator winding short circuit in the motor, said system comprising:
    an inverter module including a pair of gate drives corresponding to each of three phases of stator windings in the motor, where each pair of the gate drives converts electrical energy from a direct current (DC) power supply into pulse-width-modulated (PWM) voltage inputs to one of the phases of the stator windings;
    two current sensors, where one sensor is provided for measuring current in each of two phases of the stator windings; and
    a control module in communication with the current sensors, the gate drives and a rotor position sensor on the motor, said control module being configured with a first algorithm for controlling the gate drives for normal operation of the motor, and configured with a second algorithm for performing a stator winding short detection test, where the stator winding short detection test includes inducing a stator winding current which produces zero motor torque, and diagnosing a stator winding short circuit if feedback current indicative of a reduced winding inductance is detected.

14. The system of claim 13 wherein the short detection test includes determining the PWM voltage inputs to induce electric currents in the three phases of the stator windings which result in zero torque being created by the motor, monitoring feedback current signals in the phases of the stator windings from the current sensors until the feedback current signals reach steady state, computing a current amplitude value from the feedback current signals, computing a ratio of the current amplitude value for the motor in a present test to the current amplitude value for the motor in a known healthy state, and determining that the stator winding short circuit exists in the motor if the ratio exceeds a predetermined threshold.

15. The system of claim 14 wherein determining the PWM voltage inputs includes performing a direct-quadrature-zero (dqo) transformation and determining the PWM voltage inputs in terms of a q-axis and a d-axis.

16. The system of claim 15 wherein the PWM voltage inputs are selected to produce a q-axis current of zero in order to create zero motor torque, and produce a d-axis current which is in a range of 1-10% of a maximum rated current for the motor.

17. The system of claim 14 wherein computing a current amplitude value from the feedback current signals includes using a Fast Fourier Transform (FFT) calculation or computing a peak-to-peak value.

18. The system of claim 14 wherein the short detection test further includes computing current amplitude values for a plurality of harmonics of a motor control frequency.

19. The system of claim 18 further comprising diagnosing, if a stator winding short circuit is present, whether the stator winding short circuit is a turn-to-turn short or a phase-to-phase short, based on the current amplitude values for the plurality of harmonics.

20. A method for identifying stator winding short circuits in a three-phase electric machine, said method comprising:
providing voltage inputs to each of three phases of stator windings, where the voltage inputs induce electric currents in the three phases of the stator windings, and the currents result in zero torque being created by the electric machine, including performing a direct-quadrature-zero (dqo) transformation and determining the voltage inputs in terms of a q-axis and a d-axis, wherein the voltage inputs are selected to produce a q-axis current of zero in order to create zero torque, and produce a d-axis current which is non-zero;
monitoring feedback current signals in the three phases of the stator windings, using current sensors, until the feedback current signals reach steady state;
computing, using a microprocessor, a current amplitude value from the feedback current signals;
computing a ratio of the current amplitude value for the electric machine in a present test to the current amplitude value for the electric machine in a known healthy state; and
determining that a stator winding short circuit exists in the electric machine if the ratio exceeds a predetermined threshold.

* * * * *